United States Patent
Chu et al.

(10) Patent No.: US 8,284,345 B2
(45) Date of Patent: Oct. 9, 2012

(54) SILICON LIGHT-EMITTING ELEMENT

(75) Inventors: Shucheng Chu, Hamamatsu (JP);
Hirofumi Kan, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/100,650

(22) Filed: May 4, 2011

(65) Prior Publication Data

US 2011/0220956 A1    Sep. 15, 2011

Related U.S. Application Data

(63) Continuation-in-part of application No. PCT/JP2009/065665, filed on Sep. 8, 2009.

(30) Foreign Application Priority Data

Nov. 6, 2008   (JP) ................. P2008-285545

(51) Int. Cl.
*G02F 1/1335*   (2006.01)
(52) U.S. Cl. ........ 349/61; 349/27; 349/52; 349/56; 349/84; 349/158
(58) Field of Classification Search ......... 349/24, 349/25, 27, 52, 56, 61, 84, 158
See application file for complete search history.

(56) References Cited

U.S. PATENT DOCUMENTS

| | | | |
|---|---|---|---|
| 6,399,225 B1 * | 6/2002 | Yamaguchi et al. | 428/690 |
| 6,831,304 B2 * | 12/2004 | Udagawa | 257/94 |
| 2010/0081227 A1 * | 4/2010 | Hong et al. | 438/47 |

FOREIGN PATENT DOCUMENTS

| | | |
|---|---|---|
| JP | 62-202573 | 9/1987 |
| JP | 8-46237 | 2/1996 |
| JP | 2000-188260 | 7/2000 |
| JP | 2000-273450 | 10/2000 |
| JP | 2007-294628 | 11/2007 |
| JP | 2007-329468 | 12/2007 |

* cited by examiner

*Primary Examiner* — Jennifer Doan
(74) *Attorney, Agent, or Firm* — Drinker Biddle & Reath LLP

(57) ABSTRACT

A silicon light-emitting element includes a first conductivity type silicon substrate 10 having a first surface 10a and a second surface 10b on a side opposite to the first surface 10a, an insulating film 11 provided on the first surface 10a of the silicon substrate 10, a silicon layer 12 provided on the insulating film 11, and having a second conductivity type different from the first conductivity type, a first electrode 13 provided on the silicon layer 12, and a second electrode 14 provided on the second surface of the silicon substrate, and the silicon substrate 10 has a carrier concentration of $5 \times 10^{15} cm^{-3}$ to $5 \times 10^{18} cm^{-3}$, the silicon layer 12 has a carrier concentration of $1 \times 10^{17} cm^{-3}$ to $5 \times 10^{19} cm^{-3}$, and that is larger by one digit or more than the carrier concentration of the silicon substrate 10, and the insulating film 11 has a film thickness of 0.3 nm to 5 nm. Accordingly, a silicon light-emitting element that is applicable to a silicon photonics light source is realized.

6 Claims, 6 Drawing Sheets

SILICON LIGHT-EMITTING ELEMENT

CROSS REFERENCE TO RELATED APPLICATION

This is a continuation-In-Part application of PCT application No. PCT/JP2009/065665 filed on Sep. 8, 2009, claiming the benefit of priorities from Japanese Patent application No. 2008-285545 filed on Nov. 6, 2008, and incorporated by reference in their entirety.

TECHNICAL FIELD

The present invention relates to a silicon light-emitting element.

BACKGROUND ART

In recent years, silicon photonics has been received a great deal of attention. Silicon photonics is a technology for reducing power consumption and increasing signal processing speed by integrating a light-emitting element using silicon, a silicon waveguide, and the like between chips in an LSI or inside a chip. As a result, there is a need for light-emitting elements using silicon that is inexpensive and small in environmental load as silicon photonics light sources. Moreover, since light with an energy lower than the band gap (approximately 1.125 eV at room temperature) of silicon (light with a wavelength of approximately 1100 nm or more) is easily transmitted through the silicon waveguide, light-emitting elements that emit such light have been demanded. Examples of light-emitting elements using silicon have been disclosed in Patent Literature 1 and Patent Literature 2. The silicon light-emitting diodes disclosed in Patent Literature 1 and Patent Literature 2 both have pn-junctions with thicknesses of 10 nm or less on their SOI substrates. These silicon light-emitting diodes disclosed in Patent Literature 1 and Patent Literature 2 emit light (wavelength of approximately 770 nm to 1000 nm) with an energy higher than the band gap of silicon. This is considered to be due to the quantum confinement effect caused by thinning the pn-junctions.

Citation List

Patent Literature

Patent Literature 1: Japanese Patent Laid-Open No. 2007-294628

Patent Literature 2: Japanese Patent Laid-Open No. H08-46237

SUMMARY OF INVENTION

Technical Problem

However, the light with a wavelength of 770 nm to 1000 nm is not easily transmitted through a silicon waveguide. Therefore, it is difficult to apply the silicon light-emitting diodes disclosed in Patent Literature 1 and Patent Literature 2 to silicon photonics light sources. Moreover, silicon light-emitting elements having porous Si or Si/SiO$_2$ nanostructures are known as other light-emitting elements using silicon. However, light emitted by the silicon light-emitting element having a porous Si or Si/SiO$_2$ nanostructure is visible light, and is still not easily transmitted through a silicon waveguide. Therefore, it is difficult to apply the silicon light-emitting elements having porous Si or Si/SiO$_2$ nanostructures to silicon photonics light sources. Accordingly, it is an object of the present invention to provide a silicon light-emitting element that is applicable to a silicon photonics light source.

Solution to Problem

A silicon light-emitting element of the present invention includes a first conductivity type silicon substrate having a first surface and a second surface on a side opposite to the first surface, an insulating film provided on the first surface of the silicon substrate, a silicon layer provided on the insulating film, and having a second conductivity type different from the first conductivity type, a first electrode provided on the silicon layer, and a second electrode provided on the second surface of the silicon substrate, and in which the silicon substrate has a carrier concentration of $5\times10^{15} cm^{-3}$ to $5\times10^{18} cm^{-3}$, the silicon layer has a carrier concentration of $1\times10^{17} cm^{-3}$ to $5\times10^{19} cm^{-3}$, and that is larger by one digit or more than the carrier concentration of the silicon substrate, and the insulating film has a film thickness of 0.3 nm to 5 nm.

Moreover, a silicon light-emitting element of the present invention includes a first conductivity type silicon substrate having a first surface and a second surface on a side opposite to the first surface, an insulating film provided on the first surface of the silicon substrate, a silicon layer provided on the insulating film, and having a second conductivity type different from the first conductivity type, a first electrode provided on the silicon layer, and a second electrode provided on the second surface of the silicon substrate, and in which the silicon layer has a carrier concentration of $5\times10^{15} cm^{-3}$ to $5\times10^{18} cm^{-3}$, the silicon substrate has a carrier concentration of $1\times10^{17} cm^{-3}$ to $5\times10^{19} cm^{-3}$, and that is larger by one digit or more than the carrier concentration of the silicon layer, and the insulating film has a film thickness of 0.3 nm to 5 nm.

Moreover, a silicon light-emitting element of the present invention includes a silicon substrate having a first surface, a first conductivity type first silicon layer provided on the first surface of the silicon substrate, and having a first region, a second region, and a third region disposed in order along the first surface, a first electrode provided on each of the first region and the third region of the first silicon layer, an insulating film provided on the second region of the first silicon layer, a second silicon layer provided on the insulating film, and having a second conductivity type different from the first conductivity type, and a second electrode provided on the second silicon layer, and in which the first silicon layer has a carrier concentration of $5\times10^{15} cm^{-3}$ to $5\times10^{18} cm^{-3}$, the second silicon layer has a carrier concentration of $1\times10^{17} cm^{-3}$ to $5\times10^{19} cm^{-3}$, and that is larger by one digit or more than the carrier concentration of the first silicon layer, and the insulating film has a film thickness of 0.3 nm to 5 nm.

Moreover, a silicon light-emitting element of the present invention includes a silicon substrate having a first surface, a first conductivity type first silicon layer provided on the first surface of the silicon substrate, and having a first region, a second region, and a third region disposed in order along the first surface, a first electrode provided on each of the first region and the third region of the first silicon layer, an insulating film provided on the second region of the first silicon layer, a second silicon layer provided on the insulating film, and having a second conductivity type different from the first conductivity type, and a second electrode provided on the second silicon layer, and in which the second silicon layer has a carrier concentration of $5\times10^{15} cm^{-3}$ to $5\times10^{18} cm^{-3}$, the first silicon layer has a carrier concentration of $1\times10^{17} cm^{-3}$ to $5\times10^{19} cm^{-3}$, and that is larger by one digit or more than the carrier concentration of the second silicon layer, and the insulating film has a film thickness of 0.3 nm to 5 nm.

The present inventor has made repeated studies in order to develop a silicon light-emitting element applicable to a silicon photonics light source of which it is required to emit light with a wavelength that is easily transmitted through a silicon waveguide at relatively high intensity. As a result of these studies, the present inventor has discovered that a silicon light-emitting element of the present invention with an insulating film having a film thickness of 0.3 nm to 5 nm emits light with a wavelength that is easily transmitted through a silicon waveguide at high intensity.

Advantageous Effects of Invention

According to the present invention, a silicon light-emitting element that is applicable to a silicon photonics light source can be provided.

BRIEF DESCRIPTION OF DRAWINGS

DESCRIPTION OF EMBODIMENTS (First Embodiment) Hereinafter, a first embodiment of a silicon light-emitting element according to the present invention will be described in detail with reference to the drawings. Also, in the description of the drawings, wherever possible, the same components are denoted with the same reference numerals, and overlapping description will be omitted. Referring to FIG. 1, description will be given of the configuration of a silicon light-emitting element 1 according to the first embodiment. FIG. 1 is a view schematically showing the configuration of the silicon light-emitting element 1 according to the first embodiment. The silicon light-emitting element 1 includes a silicon substrate 10, an insulating film 11, a silicon layer 12, a first electrode 13, and a second electrode 14. The silicon substrate 10 has a first surface 10a and a second surface 10b. Moreover, the silicon substrate 10 has an n-type conductivity (first conductivity type). The insulating film 11 is provided on the first surface 10a of the silicon substrate 10. The insulating film 11 is joined to the silicon substrate 10. The insulating film 11 can be provided as a silicon oxide film or a silicon nitride film, but may be made of another material containing silicon. The silicon layer 12 is provided on the insulating film 11. The silicon layer 12 is joined to the insulating film 11. The silicon layer 12 has a p-type conductivity (second conductivity type). The first electrode 13 is provided on the silicon layer 12. The first electrode 13 is joined to the silicon layer 12. The second electrode 14 is provided on the second surface 10b of the silicon substrate 10. The second electrode 14 is joined to the silicon substrate 10. The insulating film 11 is sandwiched between the silicon substrate 10 and the silicon layer 12.

Figure 1:
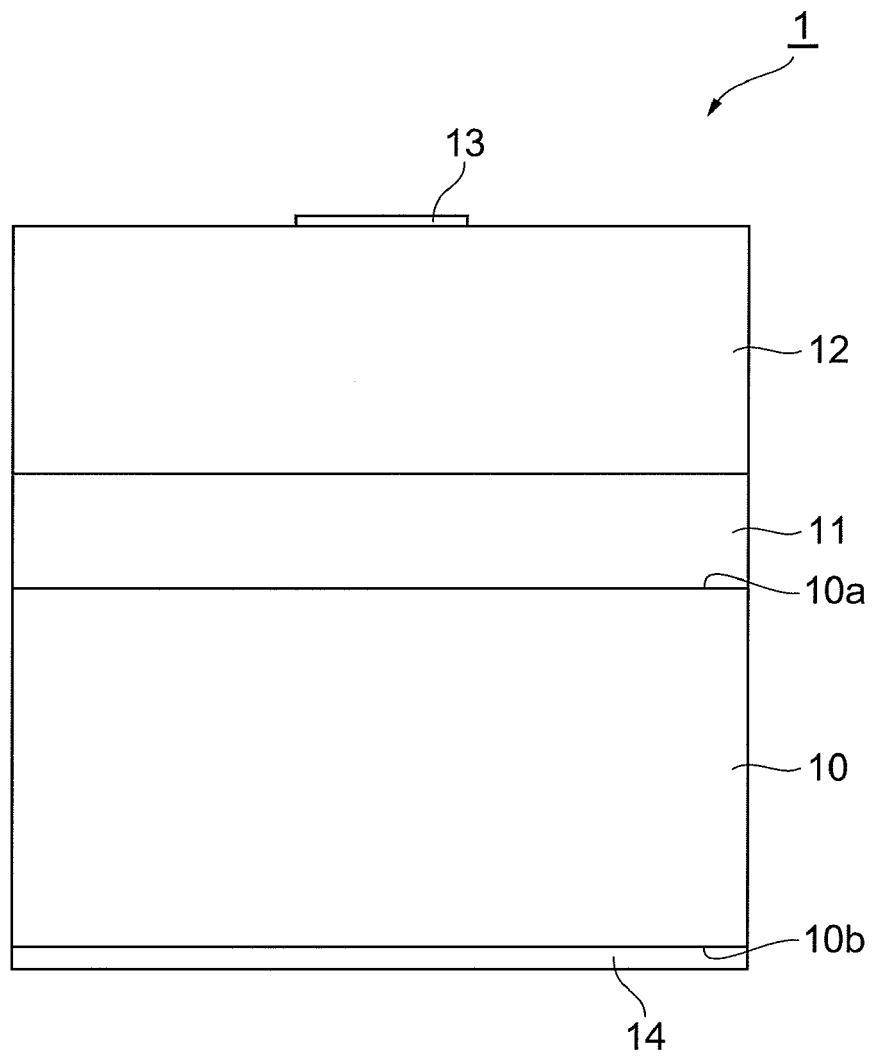
[FIG. 1] is a view schematically showing a configuration of a silicon light-emitting element according to a first embodiment.

The silicon substrate 10 has a carrier concentration of $5\times10^{15}\text{cm}^{-3}$ to $5\times10^{18}\text{cm}^{-3}$, and has a resistivity of approximately 1 Ω·cm to 0.01 Ω·cm. Moreover, the silicon layer 12 has a carrier concentration of $1\times10^{17}\text{cm}^{-3}$ to $5\times10^{19}\text{cm}^{-3}$, and has a resistivity of approximately 0.2 Ω·cm to 0.002 Ω·cm. However, the carrier concentration of the silicon layer 12 is larger by one digit or more than the carrier concentration of the silicon substrate 10. The silicon layer 12 has a thickness of 0.1 μm to 2 μm. The insulating film 11 has a film thickness of 0.3 nm to 11 nm.

Description will next be given of a manufacturing method of the silicon light-emitting element 1. First, the surface of the silicon substrate 10 is thermally oxidized to provide the insulating film 11 (silicon oxide film) on the surface of the silicon substrate 10. The method for providing the insulating film 11 may be chemical oxidation.

At this time, the oxidation temperature, oxidation time, and the like of thermal oxidation are adjusted so that the film thickness of the insulating film 11 becomes approximately 0.3 nm to 11 nm. Next, the silicon layer 12 having a thickness of 0.1 μm to 2 μm is grown on the insulating film 11. Then, the first electrode 13 and the second electrode 14 are provided by vapor deposition on the silicon layer 12 and the silicon substrate 10, respectively. Here, into the silicon substrate 10, n-type dopant is doped so that the carrier concentration becomes $5\times10^{15}\text{cm}^{-3}$ to $5\times10^{18}\text{cm}^{-3}$, and into the silicon layer 12, p-type dopant is doped so that the carrier concentration becomes $1\times10^{17}\text{cm}^{-3}$ to $5\times10^{19}\text{cm}^{-3}$. However, the respective doping amounts are adjusted so that the carrier concentration of the silicon layer 12 becomes larger by one digit or more than the carrier concentration of the silicon substrate 10.

Figure 2:
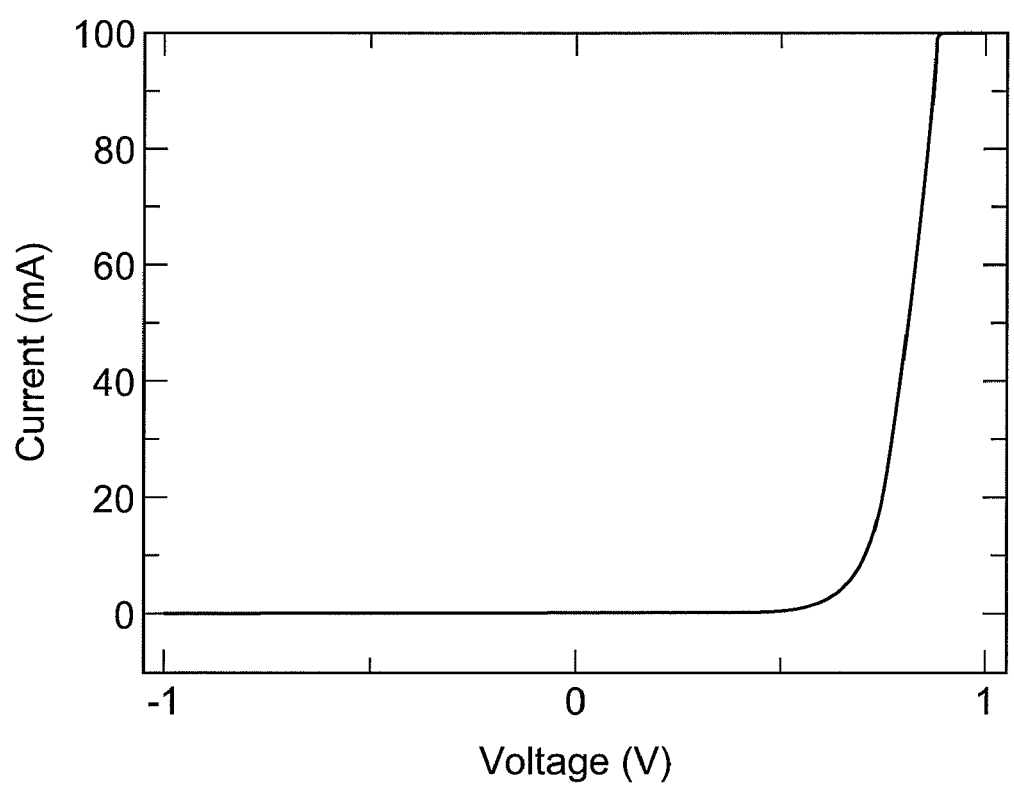
[FIG. 2] is a graph showing V-I characteristics of the silicon light-emitting element according to the first embodiment.

Next, referring to FIG. 2, description will be given of V-I characteristics (voltage-current characteristics) of the silicon light-emitting element 1. FIG. 2 shows V-I characteristics of the silicon light-emitting element 1 with the insulating film 11 having a film thickness of 2 nm. The horizontal axis of FIG. 2 indicates a bias voltage (V) applied to the silicon light-emitting element 1, and the vertical axis indicates a current (mA) that flows to the silicon light-emitting element 1. As shown in FIG. 2, it can be understood that the silicon light-emitting element 1 exhibits excellent p-n junction characteristics, and thus operates as a diode.

Figure 3:
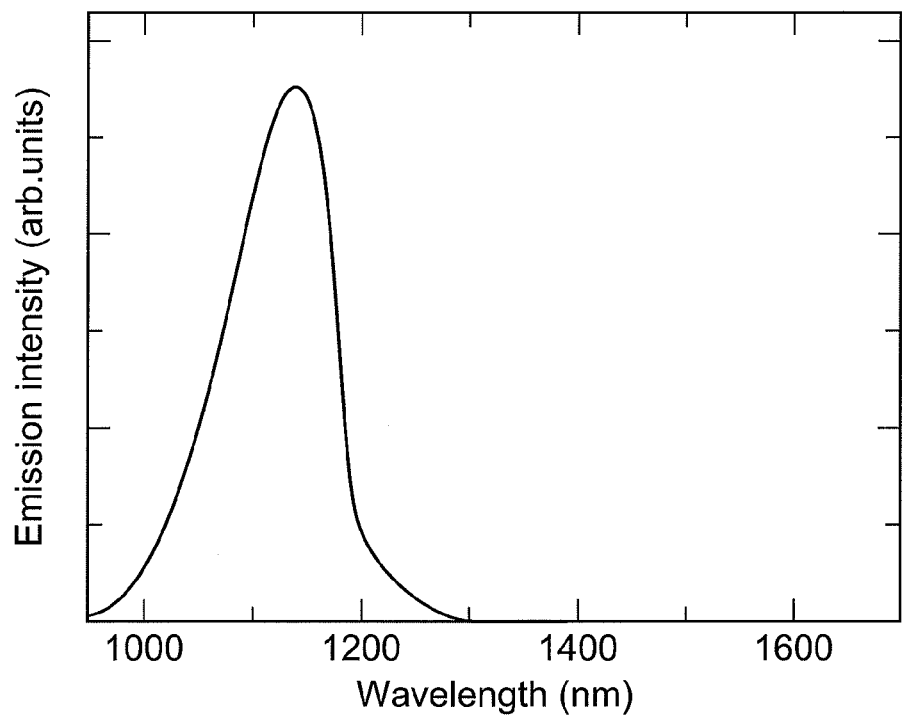
[FIG. 3] is a graph showing an emission spectrum of the silicon light-emitting element according to the first embodiment.
Figure 4:
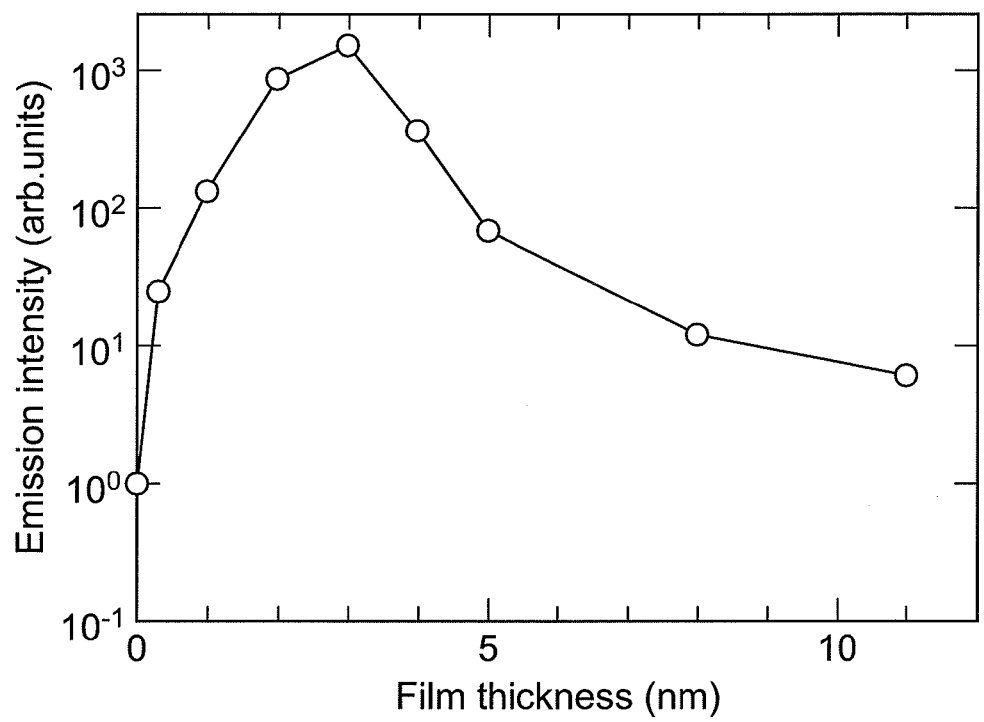
[FIG. 4] is a graph showing a relationship between the film thickness of an insulating film and the emission intensity of the silicon light-emitting element according to the first embodiment.

Then, using FIG. 3 and FIG. 4, description will be given of EL (electroluminescence) characteristics of the silicon light-emitting element 1. FIG. 3 shows an emission spectrum of the silicon light-emitting element 1 when a measuring current of 40 mA is injected at room temperature into the silicon light-emitting element 1 with the insulating film 11 having a film thickness of 2 nm. The horizontal axis of FIG. 3 indicates the wavelength (nm) of light emitted from the silicon light-emitting element 1. The vertical axis of FIG. 3 indicates the emission intensity (arb. units) of the silicon light-emitting element 1. The emission intensity can be controlled by controlling the current to be injected into the silicon light-emitting element 1, but there is no change in the spectrum. As shown in FIG. 3, the silicon light-emitting element 1 has an emission peak of approximately 1140 nm. FIG. 4 is a graph showing a relationship between the film thickness of the insulating film 11 of the silicon light-emitting element 1 and the emission intensity of the silicon light-emitting element 1. The horizontal axis of FIG. 4 indicates the film thickness (nm) of the insulating film 11. The vertical axis of FIG. 4 indicates the emission intensity (arb. units) of the silicon light-emitting element 1, and is shown by a scale that takes the emission intensity of a silicon light-emitting element without the insulating film 11 as 1. The data shown in FIG. 4 is data obtained when a measuring current of 40 mA was injected at room temperature into the silicon light-emitting element 1. As shown in FIG. 4, it can be understood that the emission intensity of the light-emitting element 1 with the insulating film 11 has been improved from the emission intensity of the silicon light-emitting element without the insulating film 11. Particularly, when the film thickness of the insulating film 11 is approximately 3 nm, the emission intensity of the silicon light-emitting element 1 has been improved by as much as three digits or more from the emission intensity of the silicon light-emitting element without the insulating film 11. This is considered as bellow: carriers generated by a current injected from the first electrode 13 and the second electrode 14 migrate through the thin insulating film 11 due to the tunneling effect, and recombine efficiently near the insulate film. In addition, since the silicon layer 12 has been doped with carriers at a higher concentration than that of the silicon substrate 10 (the carrier concentration is larger by one digit or more), carriers that migrate due to the tunneling effect from the silicon layer 12 to the silicon substrate 10 are considered to be dominant among the carriers as a whole. Accordingly, carrier recombination is considered to be limited to the vicinity of the first surface 10a of the silicon substrate 10. This is considered to be a kind of carrier confinement and an efficient recombination hence a strong light emission is possible.

As described above, the silicon light-emitting element 1 according to the present embodiment can emit light with a wavelength (light with a wavelength of approximately 1100 nm or more) that is easily transmitted through a silicon waveguide, as shown in FIG. 3. Moreover, as shown in FIG. 4, when the film thickness of the insulating film 11 is 0.3 nm to 5 nm, the emission intensity of the silicon light-emitting element 1 has been improved by as much as three digits or more at maximum from the emission intensity of the silicon light-emitting element without the insulating film 11. Moreover, as shown in FIG. 2, since the silicon light-emitting element 1 has an operating voltage of 1V, which is low, this allows stable current injection. Moreover, the results shown in FIG. 2 to FIG. 4 show room-temperature operations of the silicon light-emitting element 1. Moreover, the silicon substrate 10, the insulating film 11, and the silicon layer 12 contain Si. Thus, the silicon light-emitting element 1 is formed of a silicon-based material or a silicon processing compatible material, emits light with a wavelength that can be easily transmitted through a silicon waveguide at high intensity, allows stable current injection, and can be used at room temperature, and is therefore suitable for a silicon photonics light source.

In addition, the carrier concentrations of the silicon substrate 10 and the silicon layer 12 are not limited to those in the case described above. For example, it can be provided that the carrier concentration of the silicon layer 12 is $5 \times 10^{15} cm^{-3}$ to $5 \times 10^{18} cm^{-3}$, the carrier concentration of the silicon substrate 10 is $1 \times 10^{17} cm^{-3}$ to $5 \times 10^{19} cm^{-3}$, and the carrier concentration of the silicon substrate 10 is larger by one digit or more than the carrier concentration of the silicon layer 12. Thus, when the silicon substrate 10 has been doped with carriers at a higher concentration than that of the silicon layer 12, carrier recombination is considered to be limited to the vicinity of a joint surface of the silicon layer 12 with the insulating film 11.

In addition, a plurality of light-emitting elements using silicon other than the silicon light-emitting element 1 are known. As such a light-emitting element, for example, a light-emitting element using a Si-based semiconductor having a SiGe superlattice is known. This light-emitting element emits infrared rays by direct transition. However, since a precise growth technique is required for the SiGe superlattice, manufacturing of this light-emitting element is not easy. On the other hand, the silicon light-emitting element 1 according to the present embodiment, as shown in FIG. 1, simple in element structure, and thus can be relatively easily manufactured. Moreover, a light-emitting element where Er has been doped into Si is also known. This light-emitting element emits light with a wavelength of approximately 1.5 μm. However, this light-emitting element has very weak emission intensity at room temperature.

Figure 5:
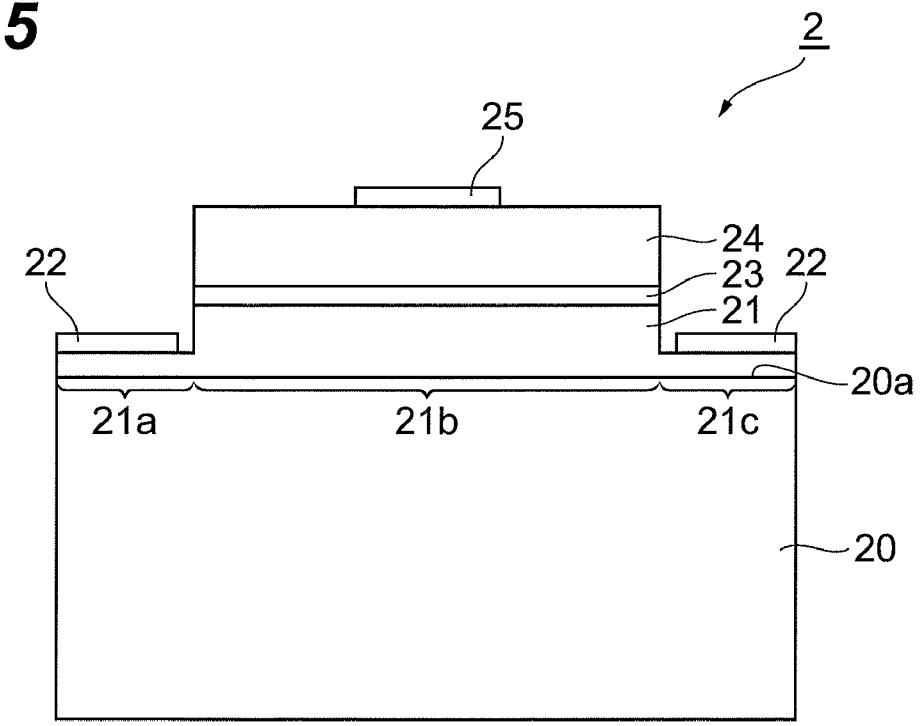
[FIG. 5] is a view schematically showing a configuration of a silicon light-emitting element according to a second embodiment.

(Second Embodiment) Then, a second embodiment of a silicon light-emitting element according to the present invention will be described in detail. Referring to FIG. 5, description will be given of the configuration of a silicon light-emitting element 2 according to the second embodiment. FIG. 5 is a view schematically showing the configuration of the silicon light-emitting element 2 according to the second embodiment. The silicon light-emitting element 2 includes a silicon substrate 20, a first silicon layer 21, a first electrode 22, an insulating film 23, a second silicon layer 24, and a second electrode 25. The silicon substrate 20 has a first surface 20a. The first silicon layer 21 has an n-type conductivity (first conductivity type). The first silicon layer 21 is provided on the first surface 20a of the silicon substrate 20. Moreover, the first silicon layer 21 is joined to the silicon substrate 20. Further, the first silicon layer 21 has a first region 21a, a second region 21b, and a third region 21c disposed in order along the first surface 20a of the silicon substrate 20. The thickness of the first region 21a and the thickness of the third region 21c are substantially the same, but the second region 21b is thicker than the first region 21a and the third region 21c. Therefore, the second region 21b is projected further than the surface of the first region 21a and the third region 21c. Thus, there is a step provided on the surface of the first silicon layer 21. The first electrode 22 is provided on each of the first region 21a and the third region 21c of the first silicon layer 21. The first electrode 22 is joined to the first silicon layer 21. The insulating film 23 is provided on the second region 21b of the first silicon layer 21. The insulating film 23 is joined to the first silicon layer 21. The insulating film 23 can be provided as a silicon oxide film or a silicon nitride film, but may be made of another material containing silicon. The second silicon layer 24 has a p-type conductivity (second conductivity type). The second silicon layer 24 is provided on the insulating film 23. Moreover, the second silicon layer 24 is joined to the insulating film 23. The second electrode 25 is provided on the second silicon layer 24. The second electrode 25 is joined to the second silicon layer 24. The insulating film 23 is sandwiched between the first silicon layer 21 and the second silicon layer 24.

The first silicon layer 21 has a carrier concentration of $5 \times 10^{15} cm^{-3}$ to $5 \times 10^{18} cm^{-3}$, and has a resistivity of approximately 1 Ω·cm to 0.01 Ω·cm. Moreover, the second silicon layer 24 has a carrier concentration of $1 \times 10^{17} cm^{-3}$ to $5 \times 10^{19} cm^{-3}$, and has a resistivity of approximately 0.2 Ω·cm to 0.002 Ω·cm. However, the carrier concentration of the second silicon layer 24 is larger by one digit or more than the carrier concentration of the first silicon layer 21. The second silicon layer 24 has a thickness of 0.1 μm to 2 μm. The insulating film 23 has a film thickness of 0.3 nm to 11 nm.

Description will next be given of a manufacturing method of the silicon light-emitting element 2. First, the silicon substrate 20 is prepared, and a first silicon layer is formed by epitaxial growth on this silicon substrate 20. The surface of the first silicon layer is then thermally oxidized to provide an insulating film (silicon oxide film) on the surface of the first silicon layer. The method for providing the insulating film may be chemical oxidation. At this time, the oxidation temperature, oxidation time, and the like of thermal oxidation are adjusted so that the film thickness of the insulating film becomes approximately 0.3 nm to 11 nm. Next, a second silicon layer having a thickness of 0.1 μm to 2 μm is formed by epitaxial growth on the insulating film. Here, into the first silicon layer, n-type dopant is doped so that the carrier concentration becomes $5\times10^{15}\text{cm}^{-3}$ to $5\times10^{18}\text{cm}^{-3}$, and into the second silicon layer, p-type dopant is doped so that the carrier concentration becomes $1\times10^{17}\text{cm}^{-3}$ to $5\times10^{19}\text{cm}^{-3}$. However, the respective doping amounts are adjusted so that the carrier concentration of the second silicon layer becomes larger by one digit or more than the carrier concentration of the first silicon layer. Then, the insulating film and second silicon layer thus provided are removed by etching leaving their central parts (marginal parts of the insulating film and the second silicon layer are removed by etching) to expose a part (marginal part) of the first silicon layer. The exposed part of the first silicon layer is further etched to provide a step on the surface of the first silicon layer. By this etching, the first silicon layer 21, the insulating film 23, and the second silicon layer 24 are formed on the silicon substrate 20. Thereafter, the first electrode 22 is provided by vapor deposition on the first region 21*a* and the third region 21*c* of the first silicon layer 21 exposed by the above-described etching. Further, the second electrode 25 is provided by vapor deposition on the second silicon layer 24. The silicon light-emitting element 2 according to the second embodiment described above can be controlled in carrier concentration within the first silicon layer 21 with high degrees of freedom, and has high applicability.

In addition, the carrier concentrations of the first silicon layer 21 and the second silicon layer 24 are not limited to those in the case described above. For example, it can be provided that the carrier concentration of the second silicon layer 24 is $5\times10^{15}\text{cm}^{-3}$ to $5\times10^{18}\text{cm}^{-3}$, the carrier concentration of the first silicon layer 21 is $1\times10^{17}\text{cm}^{-3}$ to $5\times10^{19}\text{cm}^{-3}$, and the carrier concentration of the first silicon layer 21 is larger by one digit or more than the carrier concentration of the second silicon layer 24.

Figure 6:
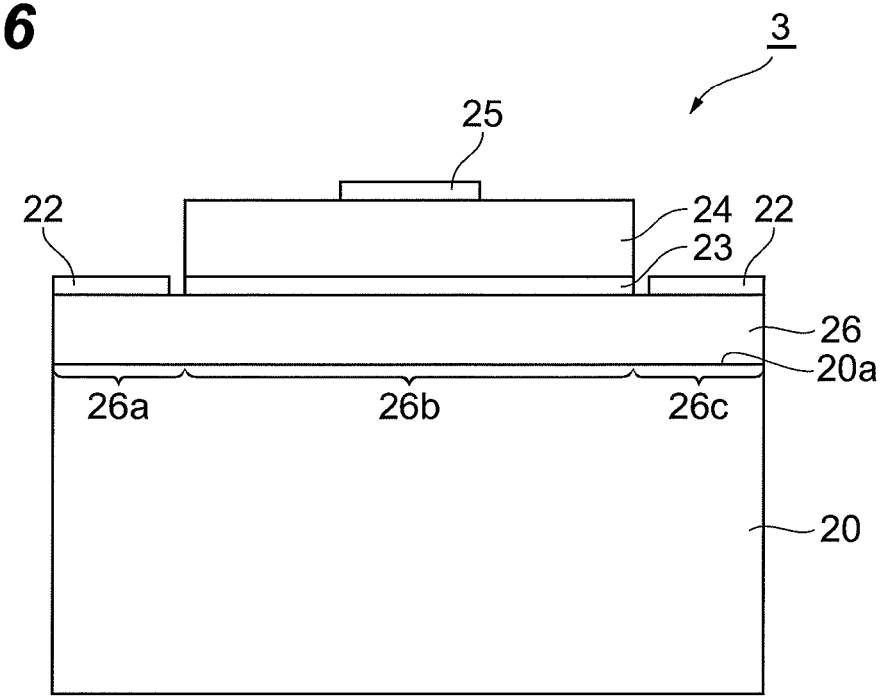
[FIG. 6] is a view schematically showing a configuration of a silicon light-emitting element according to a third embodiment.

(Third Embodiment) Next, referring to FIG. 6, a third embodiment of a silicon light-emitting element of the present invention will be described. FIG. 6 is a view schematically showing the configuration of a silicon light-emitting element 3 according to the third embodiment. The silicon light-emitting element 3 includes a first silicon layer 26 in place of the first silicon layer 21 of the silicon light-emitting element 2. The other aspects of the configuration of the silicon light-emitting element 3 are the same as those of the silicon light-emitting element 2. The first silicon layer 26 is provided on the first surface 20*a* of the silicon substrate 20. The first silicon layer 26 has a first region 26*a*, a second region 26*b*, and a third region 26*c* disposed in order along the first surface 20*a* of the silicon substrate 20. The thicknesses of the first region 26*a*, the second region 26*b*, and the third region 26*c* are substantially the same. Therefore, there is no step provided on the surface of the first silicon layer 26. The insulating film 23, the second silicon layer 24, and the second electrode 25 are provided in order on the second region 26*b*. The first silicon layer 26 has a carrier concentration of $5\times10^{15}\text{cm}^{-3}$ to $5\times10^{18}\text{cm}^{-3}$, and has a resistivity of approximately 1 Ω·cm to 0.01 Ω·cm. Moreover, the second silicon layer 24 has a carrier concentration of $1\times10^{17}\text{cm}^{-3}$ to $5\times10^{19}\text{cm}^{-3}$, and has a resistivity of approximately 0.2 Ω·cm to 0.002 Ω·cm. However, the carrier concentration of the second silicon layer 24 is larger by one digit or more than the carrier concentration of the first silicon layer 26. The silicon light-emitting element 3 according to the third embodiment described above can be controlled in carrier concentration within the first silicon layer 26 with high degrees of freedom, and has high applicability.

In addition, the carrier concentrations of the first silicon layer 26 and the second silicon layer 24 are not limited to those in the case described above. For example, it can be provided that the carrier concentration of the second silicon layer 24 is $5\times10^{15}\text{cm}^{-3}$ to $5\times10^{18}\text{cm}^{-3}$, the carrier concentration of the first silicon layer 26 is $1\times10^{17}\text{cm}^{-3}$ to $5\times10^{19}\text{cm}^{-3}$, and the carrier concentration of the first silicon layer 26 is larger by one digit or more than the carrier concentration of the second silicon layer 24.

Here, in the silicon light-emitting element by the above-described first embodiment, used is a configuration including a first conductivity type silicon substrate having a first surface and a second surface on a side opposite to the first surface, an insulating film provided on the first surface of the silicon substrate, a silicon layer provided on the insulating film, and having a second conductivity type different from the first conductivity type, a first electrode provided on the silicon layer, and a second electrode provided on the second surface of the silicon substrate, in which the silicon substrate has a carrier concentration of $5\times10^{15}\text{cm}^{-3}$ to $5\times10^{18}\text{cm}^{-3}$, the silicon layer has a carrier concentration of $1\times10^{17}\text{cm}^{-3}$ to $5\times10^{19}\text{cm}^{-3}$, and that is larger by one digit or more than the carrier concentration of the silicon substrate, and the insulating film has a film thickness of 0.3 nm to 5 nm.

Alternatively, in the silicon light-emitting element by the above-described first embodiment, used is a configuration including a first conductivity type silicon substrate having a first surface and a second surface on a side opposite to the first surface, an insulating film provided on the first surface of the silicon substrate, a silicon layer provided on the insulating film, and having a second conductivity type different from the first conductivity type, a first electrode provided on the silicon layer, and a second electrode provided on the second surface of the silicon substrate, in which the silicon layer has a carrier concentration of $5\times10^{15}\text{cm}^{-3}$ to $5\times10^{18}\text{cm}^{-3}$, the silicon substrate has a carrier concentration of $1\times10^{17}\text{cm}^{-3}$ to $5\times10^{19}\text{cm}^{-3}$, and that is larger by one digit or more than the carrier concentration of the silicon layer, and the insulating film has a film thickness of 0.3 nm to 5 nm.

Moreover, in the silicon light-emitting element by the above-described second and third embodiments, used is a configuration including a silicon substrate having a first surface, a first conductivity type first silicon layer provided on the first surface of the silicon substrate, and having a first region, a second region, and a third region disposed in order along the first surface, a first electrode provided on each of the first region and the third region of the first silicon layer, an insulating film provided on the second region of the first silicon layer, a second silicon layer provided on the insulating film, and having a second conductivity type different from the first conductivity type, and a second electrode provided on the second silicon layer, in which the first silicon layer has a carrier concentration of $5\times10^{15}\text{cm}^{-3}$ to $5\times10^{18}\text{cm}^{-3}$, the second silicon layer has a carrier concentration of $1\times10^{17}\text{cm}^{-3}$ to $5\times10^{19}\text{cm}^{-3}$, and that is larger by one digit or more than the carrier concentration of the first silicon layer, and the insulating film has a film thickness of 0.3 nm to 5 nm.

Alternatively, in the silicon light-emitting element by the above-described second and third embodiments, used is a configuration including a silicon substrate having a first surface, a first conductivity type first silicon layer provided on the first surface of the silicon substrate, and having a first region, a second region, and a third region disposed in order along the first surface, a first electrode provided on each of the first region and the third region of the first silicon layer, an insulating film provided on the second region of the first silicon layer, a second silicon layer provided on the insulating film, and having a second conductivity type different from the first conductivity type, and a second electrode provided on the second silicon layer, in which the second silicon layer has a carrier concentration of $5\times10^{15}$cm$^{-3}$ to $5\times10^{18}$cm$^{-3}$, the first silicon layer has a carrier concentration of $1\times10^{17}$cm$^{-3}$ to $5\times10^{19}$cm$^{-3}$, and that is larger by one digit or more than the carrier concentration of the second silicon layer, and the insulating film has a film thickness of 0.3 nm to 5 nm.

In the silicon light-emitting element by the first to the third embodiments thus configured, the insulating film is preferably made of a material containing silicon, and more specifically, the insulating film preferably is a silicon oxide film or a silicon nitride film.

Industrial Applicability

The silicon light-emitting element of the present invention can emit light with a wavelength that can be easily transmitted through a silicon waveguide at high intensity, and is therefore, applicable as a silicon photonics light source.

Reference Signs List 1, 2, 3 . . . Silicon light-emitting element, 10, 20 . . . Silicon substrate, 10a, 20a . . . First surface, 10b . . . Second surface, 11, 23 . . . Insulating film, 12 . . . Silicon layer, 13, 22 . . . First electrode, 14, 25 . . . Second electrode, 21, 26 . . . First silicon layer, 24 . . . Second silicon layer, 21a, 26a . . . First region, 21b, 26b . . . Second region, 21c, 26c . . . Third region.

The invention claimed is:

1. A silicon light-emitting element comprising:
a first conductivity type silicon substrate having a first surface and a second surface on a side opposite to the first surface;
an insulating film provided on the first surface of the silicon substrate;
a silicon layer provided on the insulating film, and having a second conductivity type different from the first conductivity type;
a first electrode provided on the silicon layer; and
a second electrode provided on the second surface of the silicon substrate, wherein
the silicon substrate has a carrier concentration of $5\times10^{15}$ cm$^{-3}$ to $5\times10^{18}$ cm$^{-3}$,
the silicon layer has a carrier concentration of $1\times10^{17}$ cm$^{-3}$ to $5\times10^{19}$ cm$^{-3}$, and that is larger by one digit or more than the carrier concentration of the silicon substrate, and
the insulating film has a film thickness of 0.3 nm to 5 nm so that tunneling effect of carrier occurs.

2. A silicon light-emitting element comprising:
a first conductivity type silicon substrate having a first surface and a second surface on a side opposite to the first surface;
an insulating film provided on the first surface of the silicon substrate;
a silicon layer provided on the insulating film, and having a second conductivity type different from the first conductivity type;
a first electrode provided on the silicon layer; and
a second electrode provided on the second surface of the silicon substrate, wherein
the silicon layer has a carrier concentration of $5\times10^{15}$ cm$^{-3}$ to $5\times10^{18}$ cm$^{-3}$,
the silicon substrate has a carrier concentration of $1\times10^{17}$ cm$^{-3}$ to $5\times10^{19}$ cm$^{-3}$, and that is larger by one digit or more than the carrier concentration of the silicon layer, and
the insulating film has a film thickness of 0.3 nm to 5 nm so that tunneling effect of carrier occurs.

3. A silicon light-emitting element comprising:
a silicon substrate having a first surface;
a first conductivity type first silicon layer provided on the first surface of the silicon substrate, and having a first region, a second region, and a third region disposed in order along the first surface;
a first electrode provided on each of the first region and the third region of the first silicon layer;
an insulating film provided on the second region of the first silicon layer;
a second silicon layer provided on the insulating film, and having a second conductivity type different from the first conductivity type; and
a second electrode provided on the second silicon layer, wherein
the first silicon layer has a carrier concentration of $5\times10^{15}$ cm$^{-3}$ to $5\times10^{18}$ cm$^{-3}$,
the second silicon layer has a carrier concentration of $1\times10^{17}$ cm$^{-3}$ to $5\times10^{19}$ cm$^{-3}$, and that is larger by one digit or more than the carrier concentration of the first silicon layer, and
the insulating film has a film thickness of 0.3 nm to 5 nm so that tunneling effect of carrier occurs.

4. A silicon light-emitting element comprising:
a silicon substrate having a first surface;
a first conductivity type first silicon layer provided on the first surface of the silicon substrate, and having a first region, a second region, and a third region disposed in order along the first surface;
a first electrode provided on each of the first region and the third region of the first silicon layer;
an insulating film provided on the second region of the first silicon layer;
a second silicon layer provided on the insulating film, and having a second conductivity type different from the first conductivity type; and
a second electrode provided on the second silicon layer, wherein
the second silicon layer has a carrier concentration of $5\times10^{15}$ cm$^{-3}$ to $5\times10^{18}$ cm$^{-3}$,
the first silicon layer has a carrier concentration of $1\times10^{17}$ cm$^{-3}$ to $5\times10^{19}$cm$^{-3}$, and that is larger by one digit or more than the carrier concentration of the second silicon layer, and
the insulating film has a film thickness of 0.3 nm to 5 nm so that tunneling effect of carrier occurs.

5. The silicon light-emitting element according to claim 1, wherein the insulating film is made of a material containing silicon.

6. The silicon light-emitting element according to claim 1, wherein the insulating film is a silicon oxide film or a silicon nitride film.

* * * * *